US010069015B2

United States Patent
Cheng et al.

(10) Patent No.: US 10,069,015 B2
(45) Date of Patent: Sep. 4, 2018

(54) WIDTH ADJUSTMENT OF STACKED NANOWIRES

(71) Applicants: International Business Machines Corporation, Armonk, NY (US); Globalfoundries Inc., Grand Cayman (KY)

(72) Inventors: Kangguo Cheng, Schenectady, NY (US); Xin Miao, Guilderland, NY (US); Ruilong Xie, Schenectady, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/276,372

(22) Filed: Sep. 26, 2016

(65) Prior Publication Data

US 2018/0090624 A1    Mar. 29, 2018

(51) Int. Cl.
*H01L 29/06* (2006.01)
*H01L 29/786* (2006.01)
(Continued)

(52) U.S. Cl.
CPC .... *H01L 29/78696* (2013.01); *H01L 29/0649* (2013.01); *H01L 29/0673* (2013.01);
(Continued)

(58) Field of Classification Search
CPC ............. H01L 29/0673; H01L 29/0649; H01L 29/42392; H01L 29/6653; H01L 29/66553;
(Continued)

(56) References Cited

U.S. PATENT DOCUMENTS 5,629,548 A  5/1997 Tamaki et al.
5,885,872 A  3/1999 Tamaki et al.
(Continued)

FOREIGN PATENT DOCUMENTS

CN  104282559 A  1/2015
WO  WO2014059812 A1  4/2014
WO  WO2015000205 A1  1/2015

OTHER PUBLICATIONS

English translation of WO2015000205A1 by Yin Huaxiang et al., Jan. 8, 2015.
(Continued)

*Primary Examiner* — Tucker J Wright
*Assistant Examiner* — Mark Hatzilambrou
(74) *Attorney, Agent, or Firm* — Vazken Alexanian; Michael J. Chang, LLC

(57) ABSTRACT

In one aspect, a method of forming a semiconductor device includes the steps of: forming an alternating series of sacrificial/active layers on a wafer and patterning it into at least one nano device stack; forming a dummy gate on the nano device stack; patterning at least one upper active layer in the nano device stack to remove all but a portion of the at least one upper active layer beneath the dummy gate; forming spacers on opposite sides of the dummy gate covering the at least one upper active layer that has been patterned; forming source and drain regions on opposite sides of the nano device stack, wherein the at least one upper active layer is separated from the source and drain regions by the spacers; and replacing the dummy gate with a replacement gate. A masking process is also provided to tailor the effective device width of select devices.

14 Claims, 15 Drawing Sheets

(51) Int. Cl.
*H01L 29/423* (2006.01)
*H01L 29/66* (2006.01)

(52) U.S. Cl.
CPC .. *H01L 29/42392* (2013.01); *H01L 29/66545* (2013.01); *H01L 29/66742* (2013.01); *H01L 29/78618* (2013.01); *H01L 29/78654* (2013.01); *H01L 29/78684* (2013.01)

(58) Field of Classification Search
CPC ...... H01L 29/6656; H01L 21/28132–21/2815; H01L 21/823468; H01L 21/823864
See application file for complete search history.

(56) References Cited

U.S. PATENT DOCUMENTS

| | | | |
|---|---|---|---|
| 7,037,994 | B2 | 5/2006 | Sugita et al. |
| 7,244,549 | B2 | 7/2007 | Iwasawa et al. |
| 7,303,855 | B2 | 12/2007 | Hatakeyama et al. |
| 7,358,025 | B2 | 4/2008 | Hatakeyama |
| 7,893,492 | B2 | 2/2011 | Bedell et al. |
| 8,728,881 | B2 | 5/2014 | Zhu et al. |
| 2007/0196973 | A1* | 8/2007 | Park ................ H01L 21/82341 438/197 |
| 2012/0007052 | A1* | 1/2012 | Hobbs ................ B82Y 10/00 257/24 |
| 2014/0225065 | A1* | 8/2014 | Rachmady ........ H01L 29/42392 257/24 |
| 2014/0353825 | A1 | 12/2014 | Guillorn et al. |
| 2015/0228480 | A1 | 8/2015 | Yin et al. |
| 2016/0233317 | A1 | 8/2016 | Yin et al. |

OTHER PUBLICATIONS

English translation of CN104282559A by Yin Huaxiang et al., Jan. 14, 2015.
English translation of WO2014059812A1 by Yin Huaxiang et al., Apr. 24, 2014.

* cited by examiner

WIDTH ADJUSTMENT OF STACKED NANOWIRES

FIELD OF THE INVENTION

The present invention relates to stacked nanowire devices, and more particularly, to techniques for adjusting the effective device width of stacked nanowire devices by selectively cutting off one or more of the nanowires at the top of the stack from the source and drain regions of the device.

BACKGROUND OF THE INVENTION

Nanowires are a viable device option for continuing complementary metal-oxide semiconductor (CMOS) scaling. Stacked nanowires provide area efficiency, i.e., increasing drive current at a given layout area.

One drawback to the stacked nanowire design is that the minimum device width is the periphery of each of one nanowire stack. However, it is desired in some applications to have the flexibility to adjust the effective device width beyond the integral number of nanowire stacks. For instance, one example is static random access memory (SRAM) in which the ratio of n-channel field effect transistor (NFET) and p-channel FET (PFET) device widths may be a decimal, say 1.5 instead of 1 or 2. Such a device configuration cannot be achieved using current processing technology.

Therefore, there is a need for forming stacked nanowire devices with tunable effective device width.

SUMMARY OF THE INVENTION

The present invention provides techniques for adjusting the effective device width of stacked nanowire devices by selectively cutting off one or more of the nanowires at the top of the stack from the source and drain regions of the device. In one aspect of the invention, a method of forming a semiconductor device is provided. The method includes the steps of: forming an alternating series of sacrificial and active layers on a wafer; patterning the alternating series of sacrificial and active layers into at least one nano device stack; forming a dummy gate on the nano device stack; patterning at least one upper active layer in the nano device stack to remove all but a portion of the at least one upper active layer beneath the dummy gate; forming spacers on opposite sides of the dummy gate covering the at least one upper active layer that has been patterned; forming source and drain regions on opposite sides of the nano device stack, wherein the at least one upper active layer is separated from the source and drain regions by the spacers; and replacing the dummy gate with a replacement gate.

In another aspect of the invention, another method of forming a semiconductor device is provided. The method includes the steps of: forming an alternating series of sacrificial and active layers on a wafer; patterning the sacrificial and active layers into multiple nano device stacks; forming dummy gates on each of the nano device stacks; forming a mask that selectively covers at least a first one of the nano device stacks, leaving at least a second one of the nano device stacks uncovered; patterning at least one upper active layer in the at least one first nano device stack to remove all but a portion of the at least one upper active layer beneath the dummy gates on the at least one first device stack; removing the mask after the at least one upper active layer has been patterned; forming spacers on opposite sides of the dummy gates, wherein the spacers cover the at least one upper active layer that has been patterned in the at least one first nano device stack; forming source and drain regions on opposite sides of the nano device stacks, wherein the at least one upper active layer is separated from the source and drain regions by the spacers in the at least one first nano device stack; and replacing the dummy gates with replacement gates.

In yet another aspect of the invention, a semiconductor device is provided. The semiconductor device includes: at least one nano device stack; at least one gate over the at least one nano device stack; source and drain regions on opposite sides of the at least one nano device stack; and spacers on opposite sides of the at least one gate, wherein the spacers separate at least one upper active layer in the at least one nano device stack from the source and drain regions.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for tuning the effective device width of stacked nanowires in a semiconductor device by cutting the top semiconductor nanowire(s) in a stack, making them not connected to the source/drain. As will be described in detail below, this device width tuning is achieved via a cut process post dummy gate formation, but before spacer deposition.

The effective width is essentially the width of the device that delivers the current. For nanowires, the effective width is the total conducting surface around the periphery of each wire. Here a goal is to be able to produce devices that operate with different current levels, which is achieved by modifying the effective device width.

The present techniques will now be described by way of reference to FIGS. 1-15 which illustrate a process for forming a nanowire device having a variable device width. Namely, by way of the present process, the device width can be selectively tuned to produce devices having varying widths. For illustrative purposes only, the following example will illustrate two devices being formed on the same wafer. This is done to illustrate the selectivity of the present process for concurrently producing devices having differing widths. However, it is to be understood that the present process can be applied in the same manner described to applications involving more (or less than) two devices.

Further, it is noted that the instant example involves a gate last process. In general, a gate last process involves first forming a sacrificial or dummy gate over the channel region of the device early on in the process. This dummy gate serves as a placeholder for a final gate of the device which is placed later in the process. Namely, the dummy gate permits placement of the source and drain and, in this case, the selective cutting of the nanowire stacks, etc. Following these processing steps, the dummy gate is removed and replaced with the final device gate (also referred to herein as a replacement gate). A notable advantage of the replacement gate process is that the final/replacement gate is not exposed to potentially damaging processing conditions since it is not placed until the end of the process.

It is further notable that, while the present example employs a semiconductor-on-insulator (SOI) starting wafer, this is merely an example. Any wafer configuration can be used, such as bulk semiconductor wafer. As is known in the art, a SOI wafer generally includes an SOI layer separated from a substrate (e.g., a silicon (Si) substrate) by a buried insulator. When the buried insulator is an oxide, it is often referred to as a buried oxide or BOX.

Figure 1:
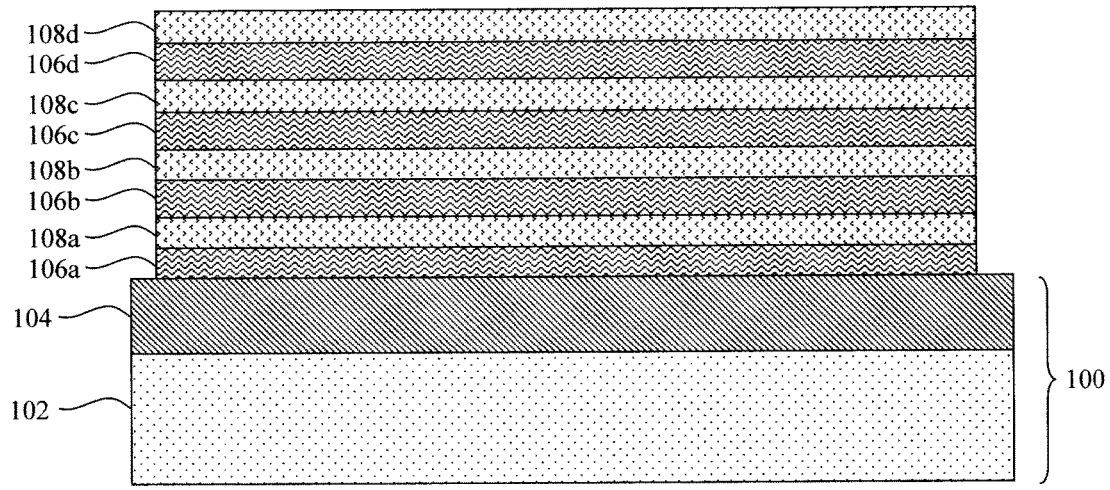
FIG. 1 is a cross-sectional diagram illustrating an alternating series of sacrificial and active layers having been formed on a wafer according to an embodiment of the present invention.

As shown in FIG. 1, the process begins by forming an alternating series of (active/sacrificial) layers on the (e.g., SOI wafer). As will be described in detail below, post-patterning, the sacrificial layers will be removed from the alternating series of layers selective to the active layers thus permitting the gate to fully surround the active layers. In this case, the layers will be patterned into a plurality of nano device stacks, i.e., stacks of device layers having nanoscale dimensions. Namely, as will be described in conjunction with the description of FIG. 2, below, when a width (W) of the active layers is in the range of from about 2 nanometers (nm) to about 10 nm, and ranges therebetween, then the device layers are referred to herein as nanowires, whereas with a larger width W, i.e., in the range of from about 10 nm to about 100 nm, and ranges therebetween, the device layers are referred to herein as nanosheets. The distinction between wires and sheets is however somewhat arbitrary since the present process is performed in the same manner regardless.

In the present example, the alternating active and sacrificial layers used are silicon (Si)/silicon germanium (SiGe), or SiGe/Si. What is important is that the material chosen for the active layer (i.e., a first material) can be etched and removed selective to the material selected for the sacrificial layer (i.e., a second material), and vice versa. Si and SiGe are suitable examples. Whichever of the Si or SiGe layer serves as the active versus sacrificial layer can vary depending on the etchant used to selectively remove the sacrificial layer. For instance, a Si-selective etchant enables use of SiGe active layers, whereas a SiGe-selective etchant enables use of Si active layers. In this case, Si is arbitrarily chosen as the active layer, and SiGe as the sacrificial layer. A further advantage to a SiGe/Si stack is that these layers can be easily grown (epitaxially) one on top of the other as a stack without imparting much strain in the layers. Thus, one should take into consideration lattice matching when choosing the active and sacrificial layers. Si/SiGe are only one example of suitable active and sacrificial layers that may be employed in accordance with the present techniques. Any device materials that can be selectively etched relative to one another can be used. For instance, other suitable examples include III-V/II-VI materials for use as the active/sacrificial layers, respectively, or vice versa. The term "III-V," as used herein, refers to a material having at least one element selected from Group III of the periodic table and at least one element selected from group V of the periodic table. In the same manner, the term "II-VI," as used herein, refers to a material having at least one element selected from Group II of the periodic table and at least one element selected from group VI of the periodic table.

As shown in FIG. 1, the starting wafer 100 includes an insulator 104 (e.g., the buried insulator in the case of an SOI wafer) over a substrate 102. To begin forming the series of layers on the wafer a first sacrificial layer 106a is formed on the insulator 104. In the case of an SOI wafer, this first sacrificial layer 106a might be the SOI layer. A first active layer 108a is then formed on the sacrificial layer 106a. Alternating sacrificial layers 106b, 106c, etc. and active layers 108b, 108c, etc. are then added on top of one another on the wafer. The number of layers formed in this step can be varied depending on the particular application, and the present techniques are not limited to the exact number of layers depicted in the present example. As highlighted above, the sacrificial and active layers can be formed using an epitaxial growth process where one layer is epitaxially grown on the previous layer.

Figure 2:
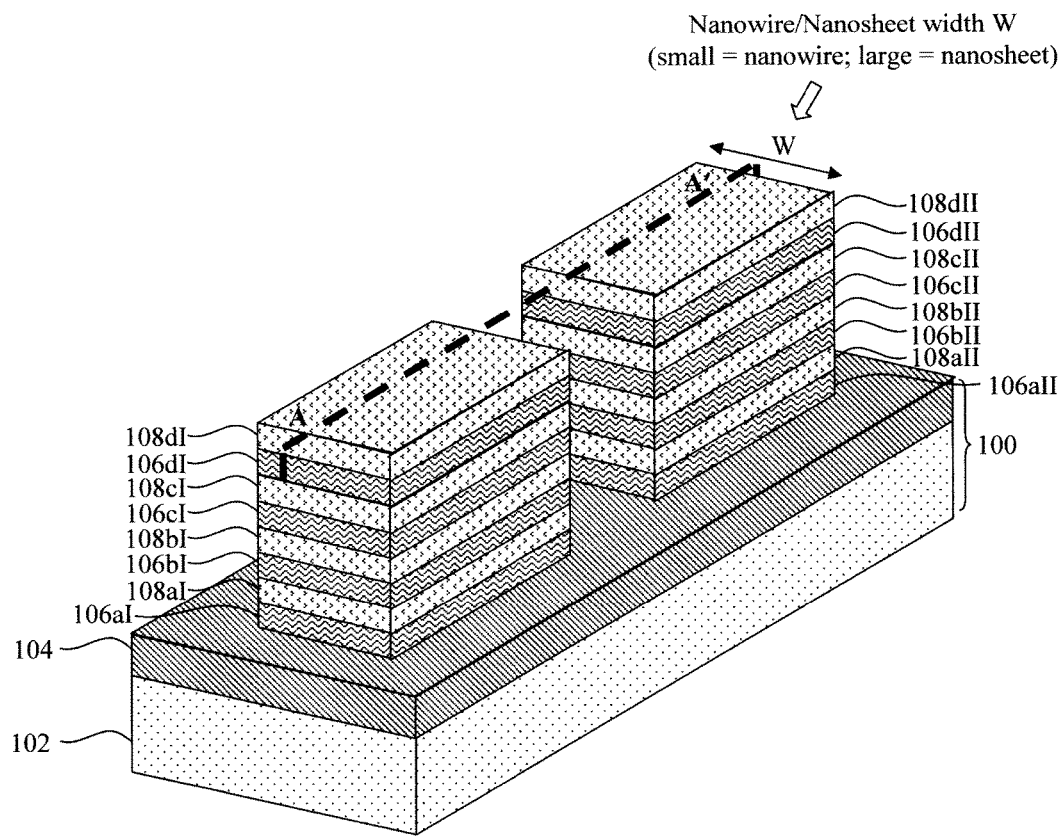
FIG. 2 is a three-dimensional diagram illustrating the sacrificial and active layers having been patterned into (multiple) individual nano (nanowire/sheet) device stacks according to an embodiment of the present invention.

The present example will be used to illustrate how the present techniques can be employed to individually tailor the device width of different devices being formed on the same wafer. In that regard, as shown in FIG. 2, the series of alternating active and sacrificial layers are next patterned into (multiple) individual nano device stacks, each nano device stack corresponding to a different field-effect transistor (FET) device. As highlighted above, the (nanoscale) dimensions of the layers in the stacks determines whether the stacks are nanowire or nanosheet stacks (i.e., with a smaller width W in the range of from about 2 nm to about 10 nm, and ranges therebetween (see FIG. 2) one has a nanowire stack, whereas with a larger width W in the range of from about 10 nm to about 100 nm, and ranges therebetween the stacks are nanosheet stacks). Thus, the term "nano device stack" generally refers herein to stacks of layers of any nanoscale dimensions, i.e., nanowires, nanosheets, etc. The number of individual stacks formed in this step will depend on the desired number of devices being formed, and thus the number of stacks can vary from what is shown in the figures. Standard lithography and etching techniques may be employed to pattern the nano device stacks, wherein a mask (not shown) is formed on the active/sacrificial layers defining the footprint and location of each individual nano device stack. An etch, e.g., reactive ion etching (RIE), through the mask is then used to pattern the individual nano device stacks. A multi-stage etch may be needed alternating between etch chemistries selective for the active and sacrificial layers, respectively. Following the nano device stack etch, each sacrificial/active layer in the first nano device stack will be given the reference numeral I, each sacrificial/active layer in the second nano device stack will be given the reference numeral II, and so on.

Figure 3:
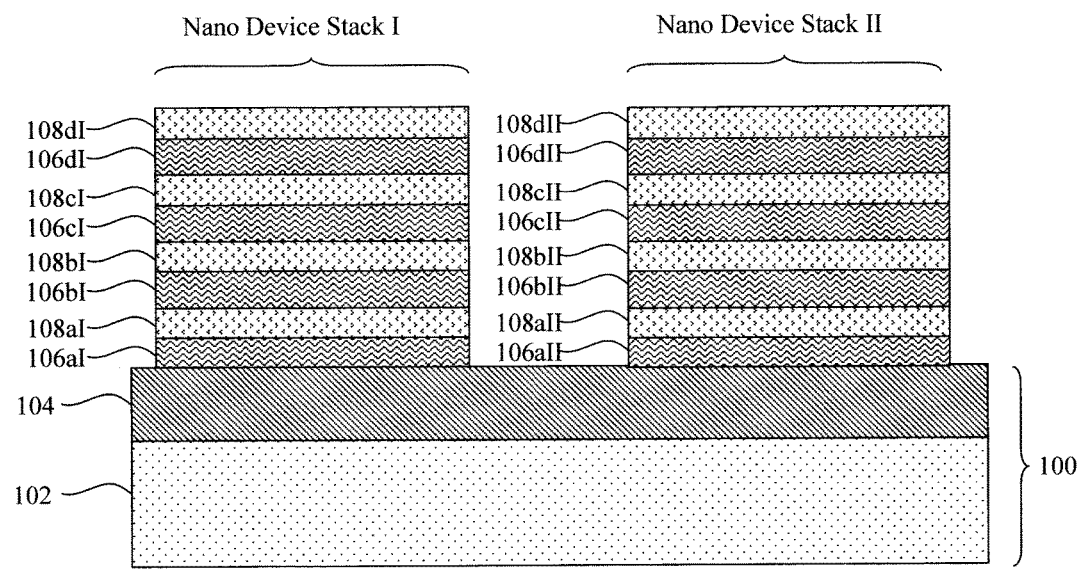
FIG. 3 is a cross-sectional diagram of the nano device stacks according to an embodiment of the present invention.

FIG. 3 provides a cross-sectional view of the nano device stacks. The depictions in FIG. 3 are cross-sectional cuts along line A-A'—see FIG. 2.

Figure 4:
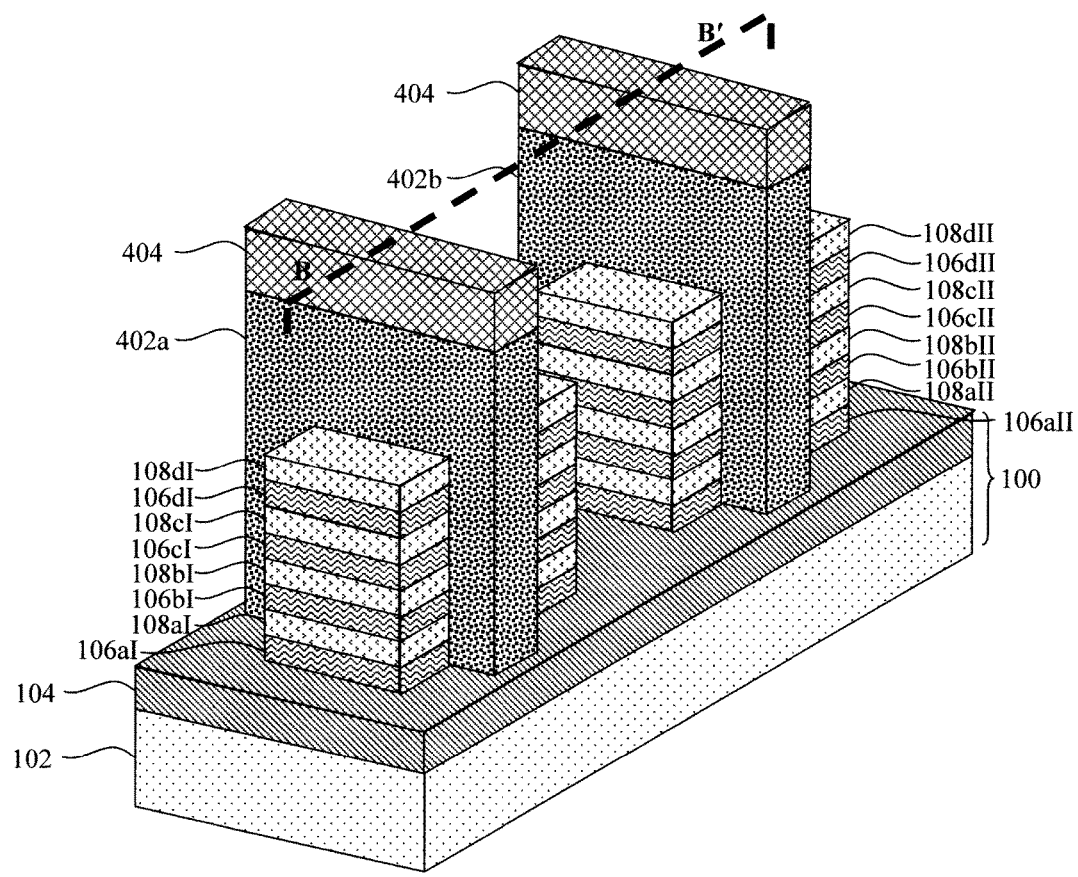
FIG. 4 is a three-dimensional diagram illustrating a dummy gate(s) having been formed on each of the nano device stacks according to an embodiment of the present invention.

The gate last process begins, as shown in FIG. 4, with the formation of a dummy gate(s) 402 on each of the nano device stacks. In the example depicted, two dummy gates 402a and 402b are formed. This is done merely to illustrate the capabilities of the present process in forming devices with varying numbers of stacked nanowires (and hence different device widths). Thus, more or fewer dummy gates 402 than shown may be formed. In this case, the dummy gate 402a will correspond to a first device, dummy gate 402b will correspond to a second device, and so on.

The dummy gate(s) 402 may be formed by first depositing a suitable dummy gate material, e.g., including but not limited to, poly-silicon. Standard lithography and etching techniques are then used to pattern one or more dummy gate hardmasks 404 on the dummy gate material. As shown in FIG. 4, the hardmasks 404 mark the footprint and location of each of the dummy gates 402. The hardmasks 404 are then used to pattern the individual dummy gates 402. A suitable hardmask material includes, but is not limited to, silicon nitride (SiN).

Figure 5:
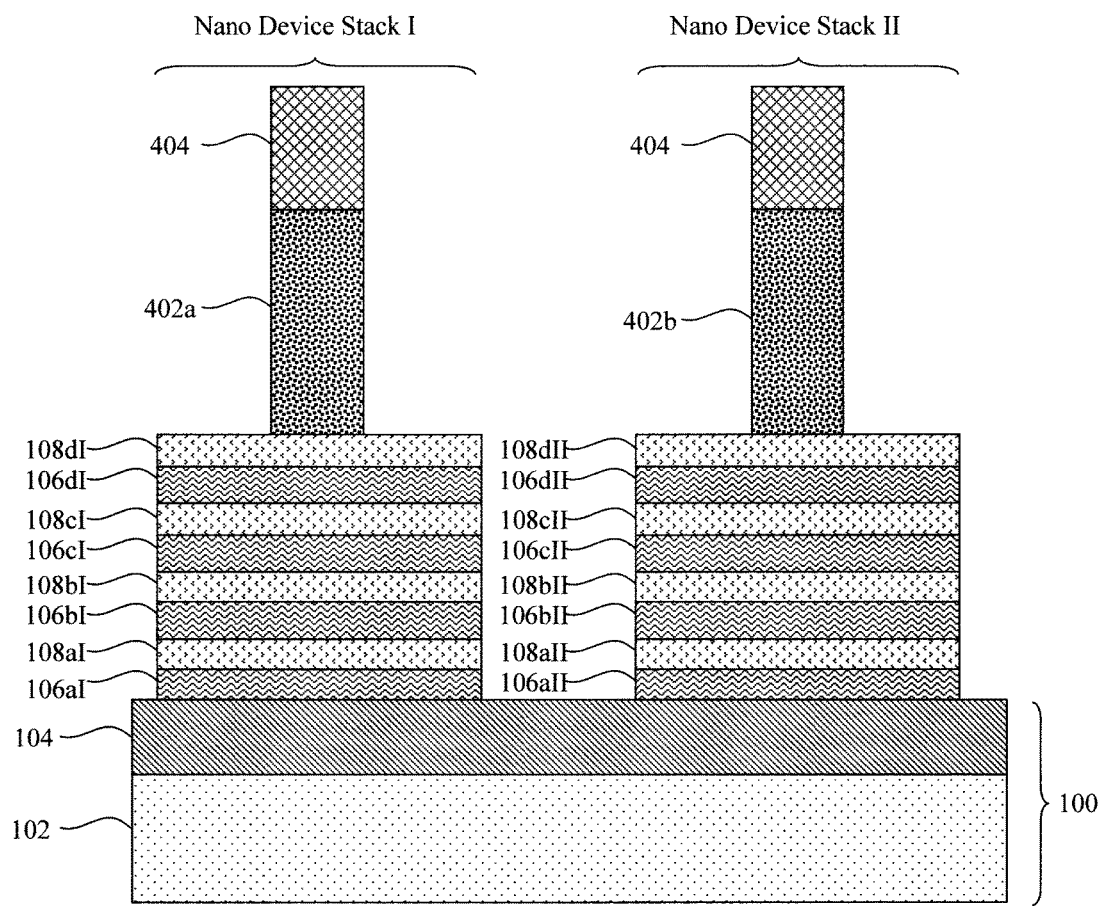
FIG. 5 is a cross-sectional diagram of the dummy gate(s) and nano device stacks according to an embodiment of the present invention.
Figure 6:
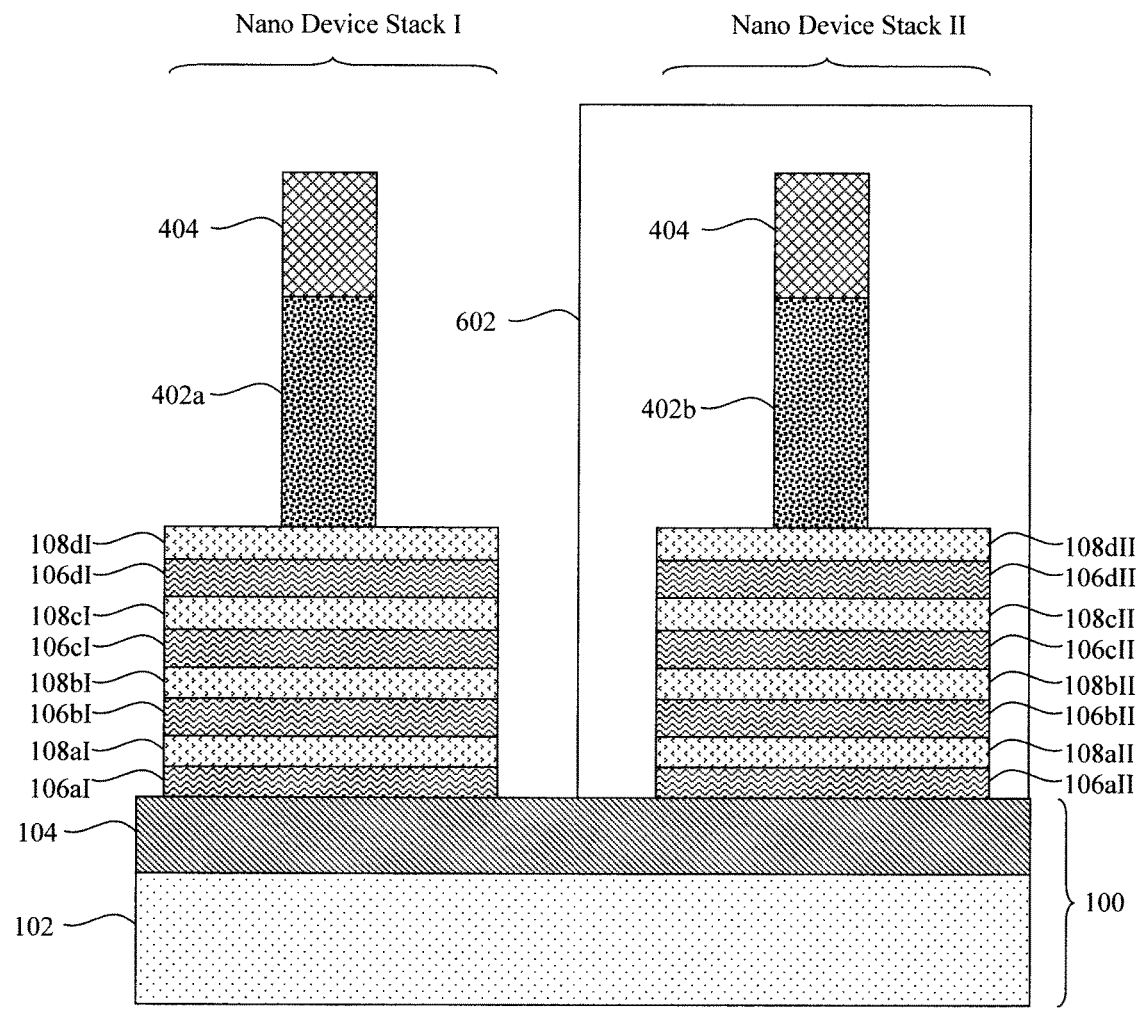
FIG. 6 is a cross-sectional diagram illustrating a mask having been formed covering one or more of the nano device stacks leaving another one or more of the nano device stacks unmasked according to an embodiment of the present invention.

FIG. 5 provides a cross-sectional view of the dummy gates on nano device stacks. The depictions in FIG. 5 are cross-sectional cuts along line B-B'—see FIG. 4.

In order to allow processing of one (or more) of the devices selective to others, a mask 602 is next formed covering/protecting one or more of the devices. See FIG. 6. According to an exemplary embodiment, the mask 602 is formed from a patterned organic planarizing layer or OPL. By way of example only, the OPL contains an aromatic cross-linkable polymer (e.g., naphthalene-based) in a solvent and is spin-coated onto the substrate, covering the stacks and dummy gates. Spin-coating ensures uniform coverage by the OPL.

Other suitable materials for use in the OPL include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference as if fully set forth herein.

A post-apply bake is then performed to cross-link the OPL and bake off the solvent. According to an exemplary embodiment, the post-apply bake is conducted at a temperature of up to about 250 degrees Celsius (° C.), e.g., from about 200° C. to about 250° C., and ranges therebetween. The OPL can then be patterned into the mask 602 using a plasma ashing process with ammonia or oxygen as the reactive species. An OPL patterning process using hydrogen silsesquioxane (HSQ) is described, for example, in U.S. Patent Application Publication Number 2014/0353825 by Guillorn et al., entitled "Silicidation Blocking Process Using Optically Sensitive HSQ Resist and Organic Planarizing Layer," the contents of which are incorporated by reference as if fully set forth herein.

With one or more of the devices now masked, the other (unmasked) devices can be selectively processed. As highlighted above, this selective processing involves cutting the top nanowires in the (unmasked) device stack such that on completion of the device these top nanowires will not be connected to the source and drain. As a result, the effective width of these cut stack devices is altered vis-à-vis the masked devices.

Figure 7:
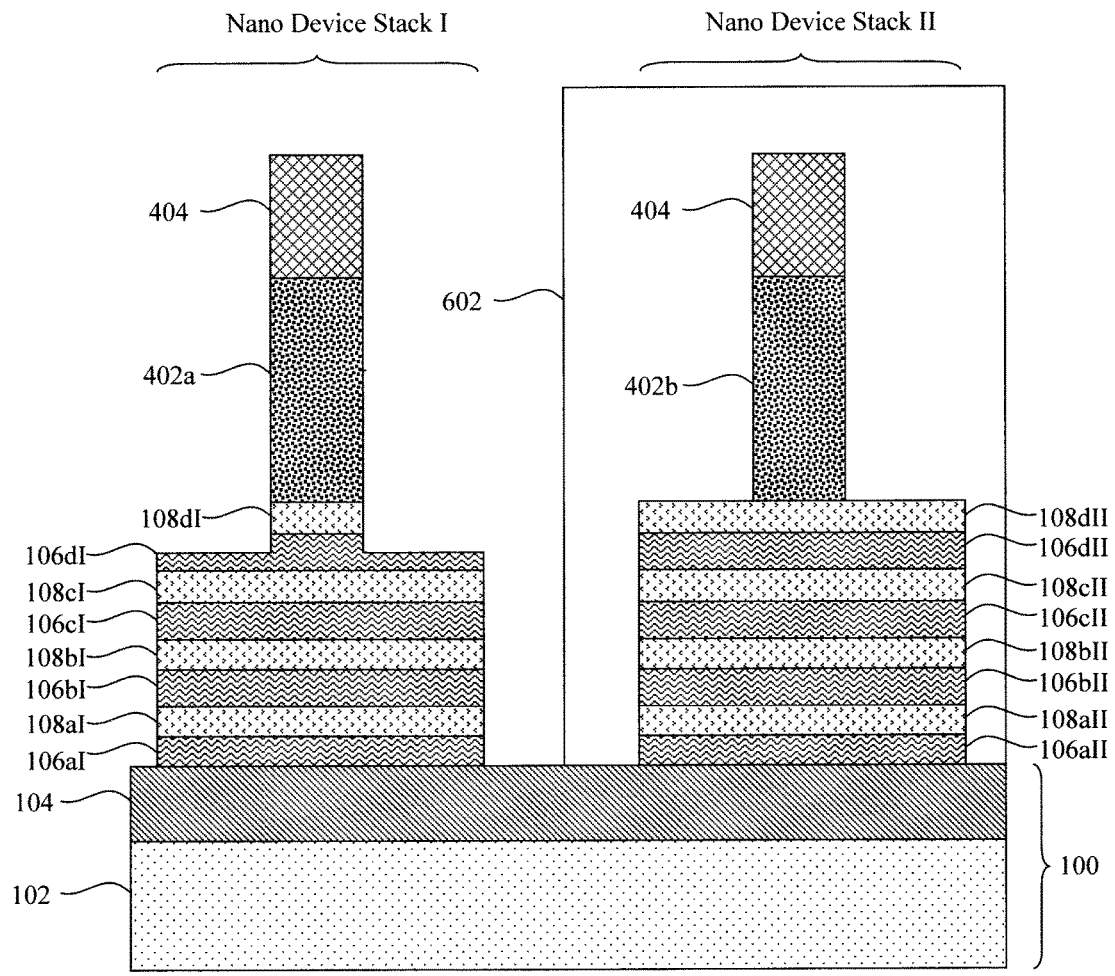
FIG. 7 is a cross-sectional diagram illustrating the top active layer(s) in the unmasked nano device stack(s) having been selectively patterned to remove all but the portions thereof directly under the dummy gate according to an embodiment of the present invention.

Specifically, as shown in FIG. 7, the top/upper active layer(s) (in this case active layer 108dI—the top/uppermost active layer in the Device Stack I) is patterned to remove all but the portions thereof directly under the dummy gate 402a. The dummy gate hardmasks remain present on top of the dummy gates, and thus protect the dummy gates during this selective etch. Another way to look at it is that the top/uppermost active layer(s) is/are patterned in this step (via the dummy gate hardmasks with the footprint and location of the dummy gates. Later in the process, once a first set of spacers is formed on opposite sides of the dummy gates, a second etch will be used to transfer the footprint and location of the dummy gate/first set of spacers to the remaining layers in the stack (i.e., to the sacrificial and active layers in the stack beneath the pre-etched top/uppermost active layer(s)).

To achieve this configuration an anisotropic etching process such as reactive ion etching (RIE) can be employed. The selectivity of the etch does not have to be tightly controlled since the sacrificial layer protects the underlying active layers. See, for example, FIG. 7 wherein to fully cut the active layer 108dI, the etch extends partway into the sacrificial layer 106dI.

It is notable that while the scenario depicted in FIG. 7 involves cutting only the top uppermost active layer in the respective device stack, this is merely an example. Namely, the etch can be extended through more than one of the upper active layers in the stack starting from the top of the stack and working downward. In doing so, one can further reduce the device width, and thereby further increase the difference in device width between the first device and the second device.

Figure 8:
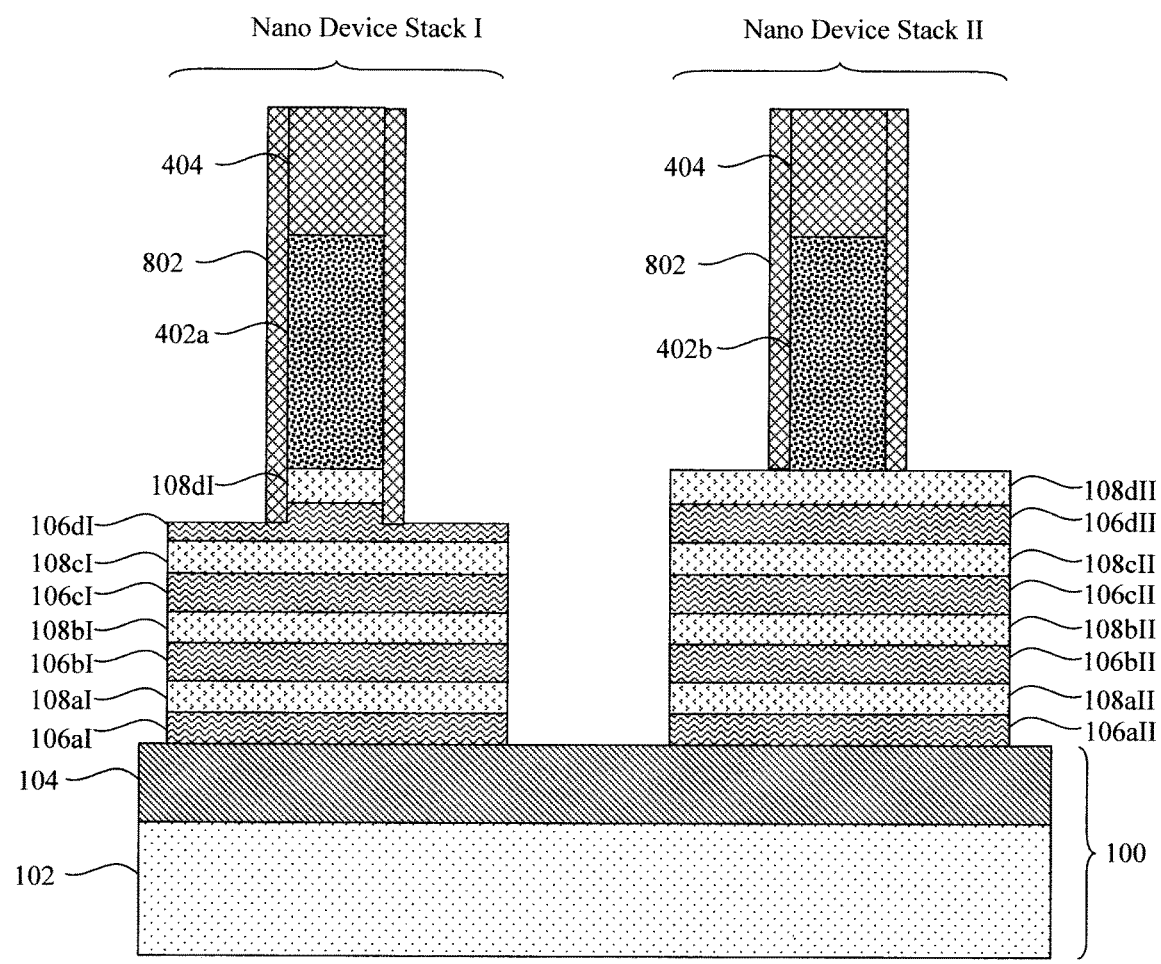
FIG. 8 is a cross-sectional diagram illustrating the mask having been removed and (first) spacers having been formed on opposite sides of the dummy gates according to an embodiment of the present invention.
Figure 9:
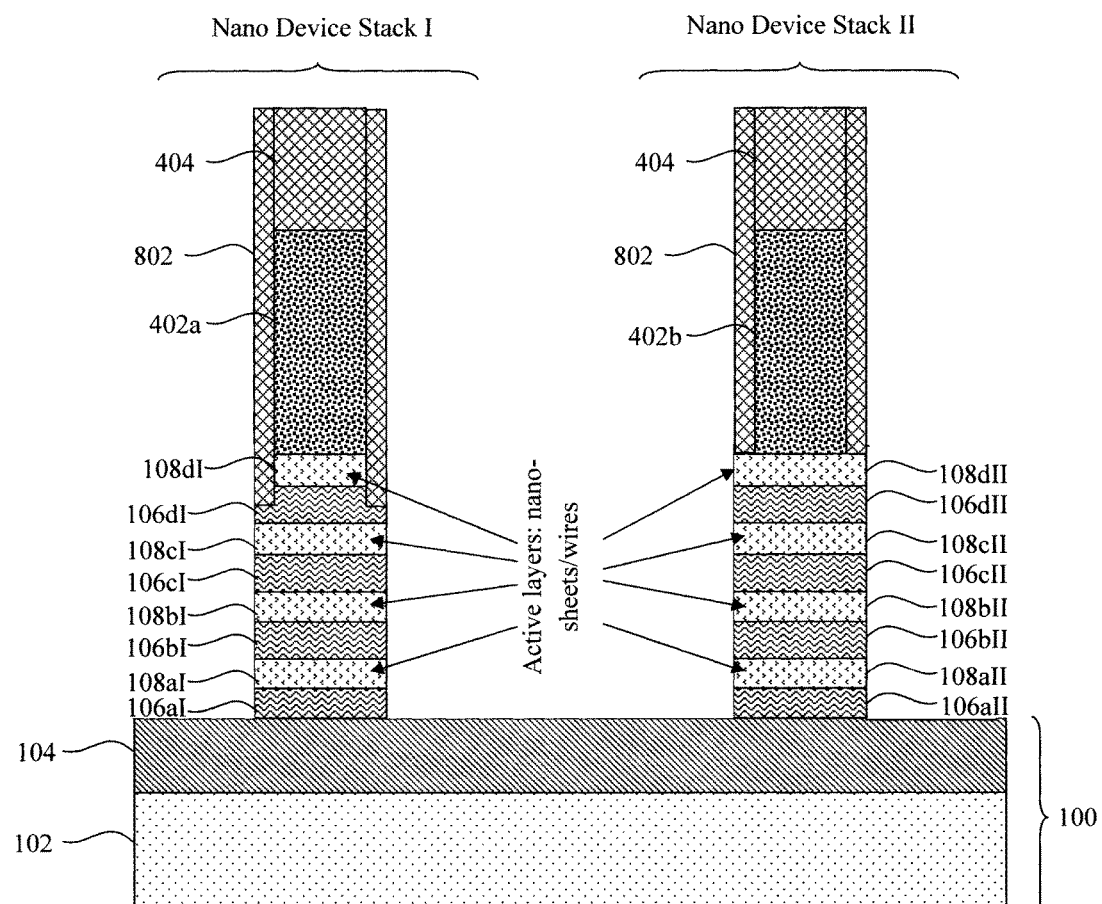
FIG. 9 is a cross-sectional diagram illustrating each nano device stack having been patterned to remove all but those portions covered by the (first) spacers and the dummy gates according to an embodiment of the present invention.

Once the selective cutting etch has been performed, the mask 602 can then be removed to permit the simultaneous processing of both device stacks. See FIG. 8. For instance, spacers 802 may next be formed on opposite sides of the dummy gates 402. It is notable that, as shown in FIG. 8, the spacers 802 cover only the ends of the active layer(s) that have been cut. This is due to the present sequence of steps where the active layer(s) is/are cut after the dummy gates are placed, but before the spacers 802 are formed. That way, the spacers 802 can cover over and block the pre-cut active layer(s). Namely, the spacers 802 will separate the pre-cut active layer(s) from the source and drain regions in the completed device (see below). A suitable material for spacers 802 includes, but is not limited to, silicon nitride (SiN), silicon dioxide ($SiO_2$), silicon borocarbonitride (SiBCN) and/or silicon oxycarbonitride (SiOCN).

Next, each nano device stack is patterned to remove all but those portions thereof covered by the dummy gates 402/spacers 802. See, for example, FIG. 9. Advantageously, the dummy gate hardmasks 404 (which have remained in place over the dummy gates) and the spacers 802 can be used as a mask during this patterning step. An anisotropic etching process such as RIE may be used here to pattern the nano device stacks down to the buried insulator 104.

This etch enables placement of the source and drain regions. Following placement of the source and drain regions, the active layers can be fully released, thereby permitting a gate all around or GAA configuration, wherein the final (replacement) gate fully surrounds a portion of each of the active layers (e.g., nano-sheets or wires—see above).

Figure 10:
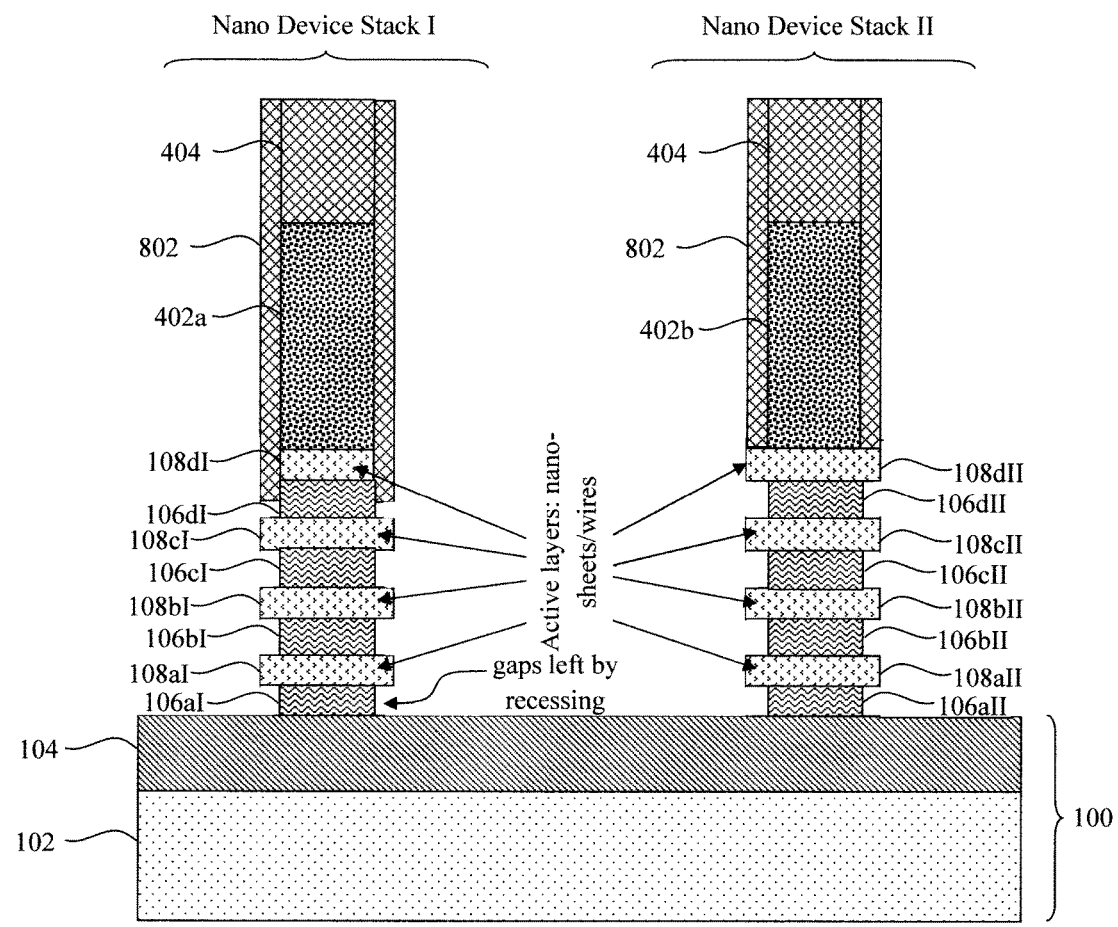
FIG. 10 is a cross-sectional diagram illustrating the sacrificial layers in the nano device stack having been recessed selective to the nanowires according to an embodiment of the present invention.

To enable access to the active layers for source and drain region formation, the sacrificial layers in the nano device stack are next recessed selective to the nanowires. See FIG. 10. As shown in FIG. 10, this recessing step involves a lateral etch of the sacrificial layers. As noted above, at this point in the process the sacrificial layers are still needed to support the active layers (e.g., nano-sheets or wires—see above). Thus, to expose the ends of the active layers for source and drain region formation, the ends of the sacrificial layers are etched, thereby laterally recessing the sacrificial layers. According to an exemplary embodiment, an isotropic etching process is used to selectively recess the sacrificial layers in the manner shown in FIG. 10. The particular etchant varies with the sacrificial material being used. For instance, hydrofluoric (HF) acid is a suitable selective etchant for a Si sacrificial material, whereas hydrochloric acid (HCL) is a suitable selective etchant for a SiGe sacrificial material.

Spacers 1102 are next formed along the recessed ends of the sacrificial layers on opposite sides of the nano device stacks. A suitable material for spacers 1102 includes, but is not limited to, SiN, $SiO_2$, SiBCN and/or SiOCN. So as to distinguish this set of spacers from the spacers previously formed adjacent to the dummy gates (see above), the spacers 802 and these spacers 1102 may also be referred to herein as a first set of spacers and a second set of spacers, respectively. The spacers 802/1102 (i.e., the first and second spacers) serve to offset the gate from the source and drain regions. As will be described in detail below, the present device has a unique configuration based on the use (e.g., of the first spacers 802 in this example) to cover the ends of the active layer(s) which have been cut.

Figure 11:
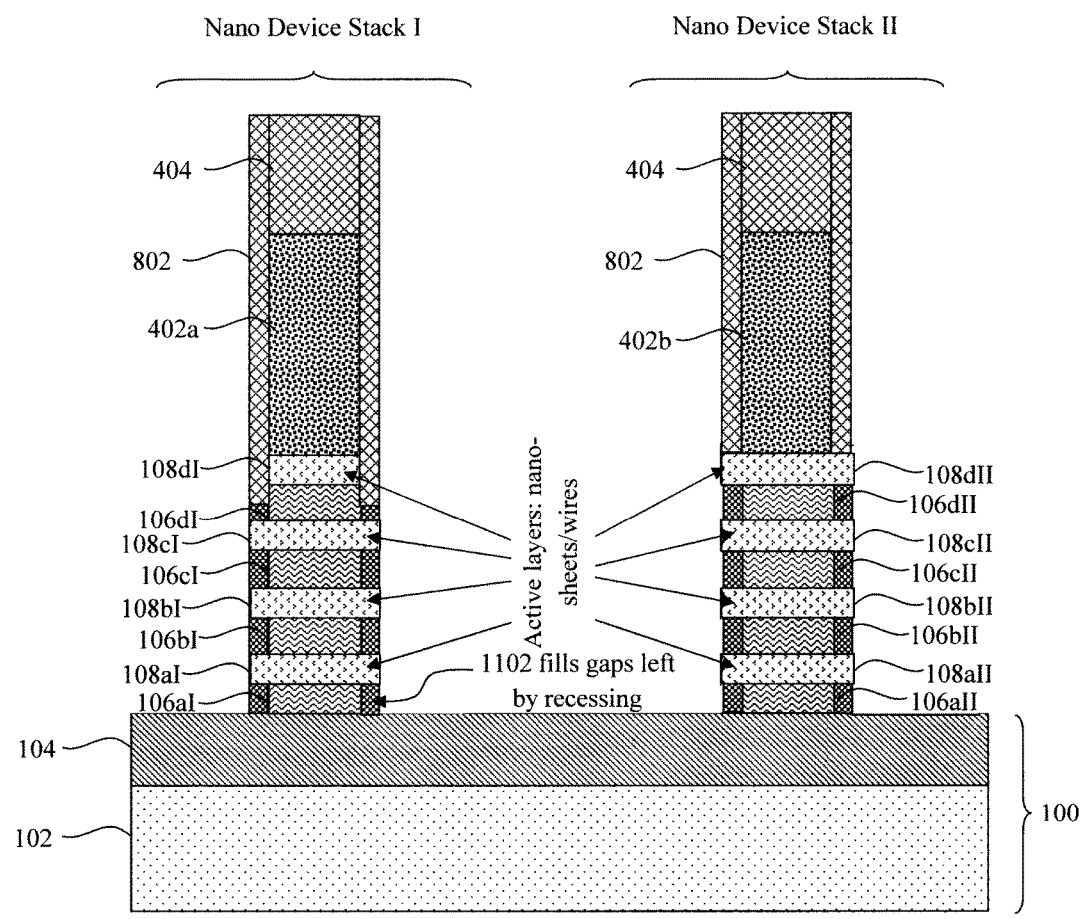
FIG. 11 is a cross-sectional diagram illustrating (second) spacers having been formed in the gaps between the active layers resulting from recessing the sacrificial layers according to an embodiment of the present invention.

According to an exemplary embodiment, the spacers 1102 are formed by first depositing a conformal layer of a suitable spacer material so as to fill the gaps between the active layers (e.g., nano-sheets/wires—see above) formed by recessing the sacrificial layers (see also FIG. 10). An isotropic etch back of the spacer material will result in the spacers 1102 being present (as shown in FIG. 11) only in the gaps between the active layers formed by recessing the sacrificial layers. The first spacers 802 (which may also be referred to herein as cladding spacers) and the second spacers 1102 (which may also be referred to herein as inner spacers) can have the same or different materials. As described above, they are placed in different locations and are also formed in different steps. Thus, while the first spacers 802 and the second spacers 1102 can be formed from the same group of materials, according to an exemplary embodiment the first spacers 802 are formed from a different material in the group than the second spacers 1102, and vice versa.

Source and drain regions 1202 are then formed on opposite sides of the nano device stack. See FIG. 12. According to an exemplary embodiment, the source and drain regions 1202 are formed using an epitaxial growth process. By way of example only, epitaxial Si or SiGe can be grown for Si and SiGe active layers, respectively. Source and drain doping can be carried out in-situ or ex-situ (e.g., using standard ion implantation). Suitable n-type dopants include, but are not limited to phosphorous (P), and suitable p-type dopants include but are not limited to boron (B).

Figure 12:
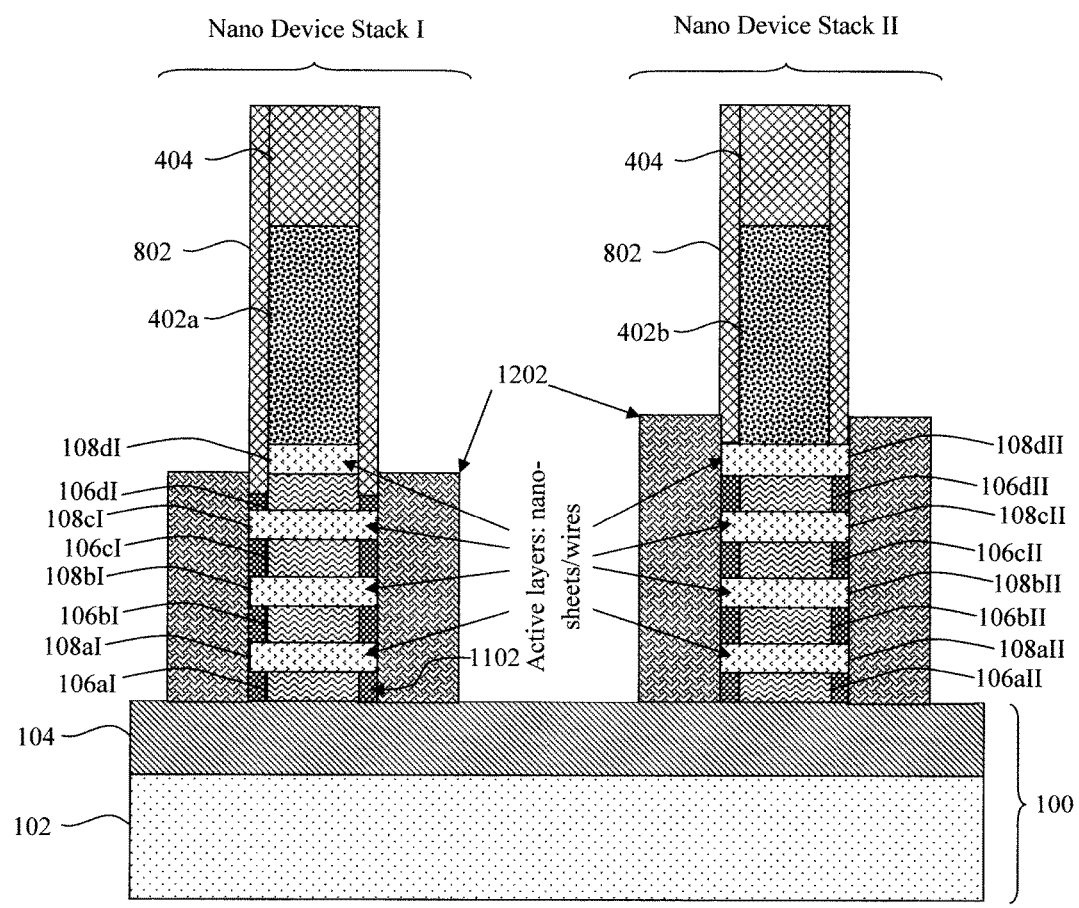
FIG. 12 is a cross-sectional diagram illustrating source and drain regions having been formed on opposite sides of the nano device stacks according to an embodiment of the present invention.
Figure 13:
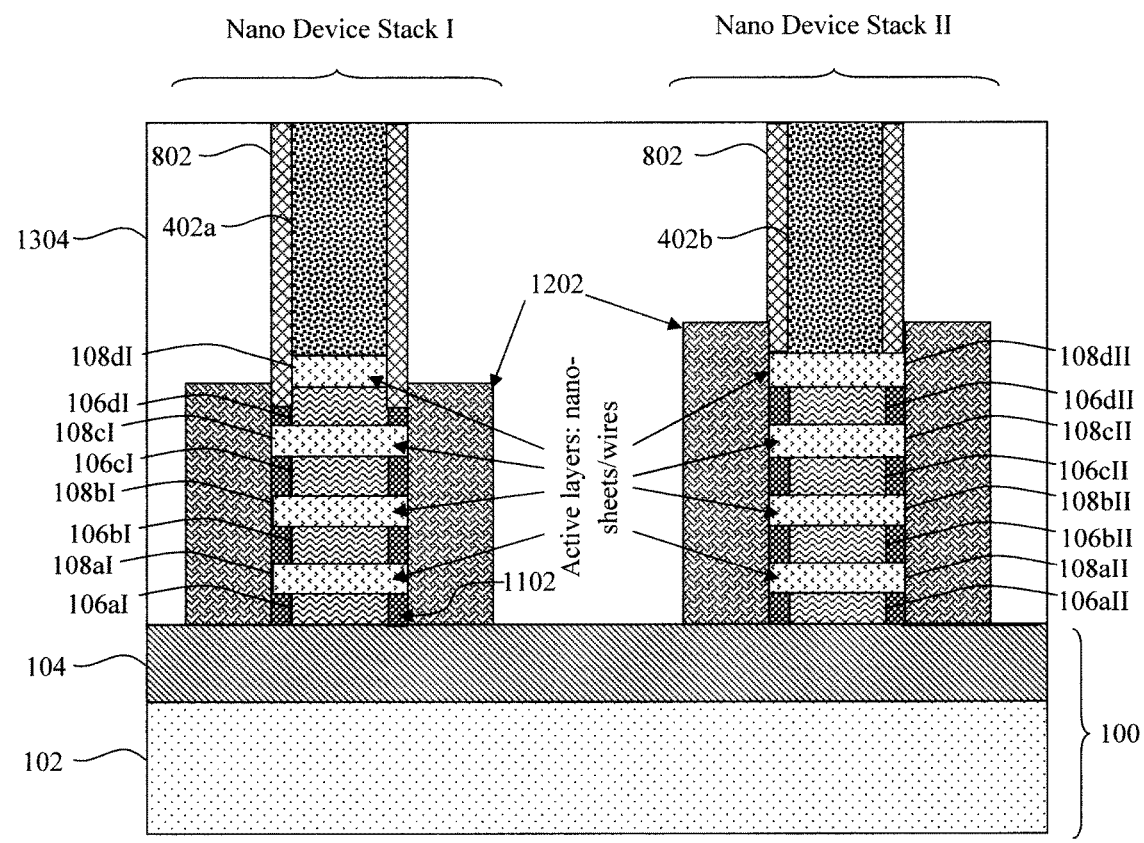
FIG. 13 is a cross-sectional diagram illustrating the dummy gates having been buried in a dielectric according to an embodiment of the present invention.

From FIG. 12 it can be clearly seen that the top uppermost active layer(s) (in this example the nano-sheet/wire formed from active layer 108dI) in the Nano Device Stack I which was cut and then covered by the spacers 802 does not make contact with the source and drain regions 1202. However, the remaining nano-sheets/wires in the Nano Device Stack I (formed from active layers 108cI, 108bI, and 108aI, respectively) are connected to the source and drain regions 1202. By contrast, since none of the nano-sheets/wires in the Nano Device Stack II were cut (see above) then all of the nano-sheets/wires in the Nano Device Stack II are connected with the source and drain regions 1202. In this manner, devices can be formed on the same wafer with different numbers of active layers carrying current, and thus different effective device widths.

The next stage in the gate last process is to remove the dummy gates and replace them with a replacement gate. In order to enable removal of the dummy gates, the dummy gates 402 are first buried in a dielectric 1304. See FIG. 13. The dielectric is then polished (e.g., using chemical mechanical polishing or CMP) to expose the tops of the dummy gates 402. This will enable the dummy gates 402 to be removed selective to the dielectric 1304. In order to expose the tops of the dummy gate 402, the dummy gate hardmasks 404 are removed in this polishing step. Compare FIG. 12 and FIG. 13.

Figure 14:
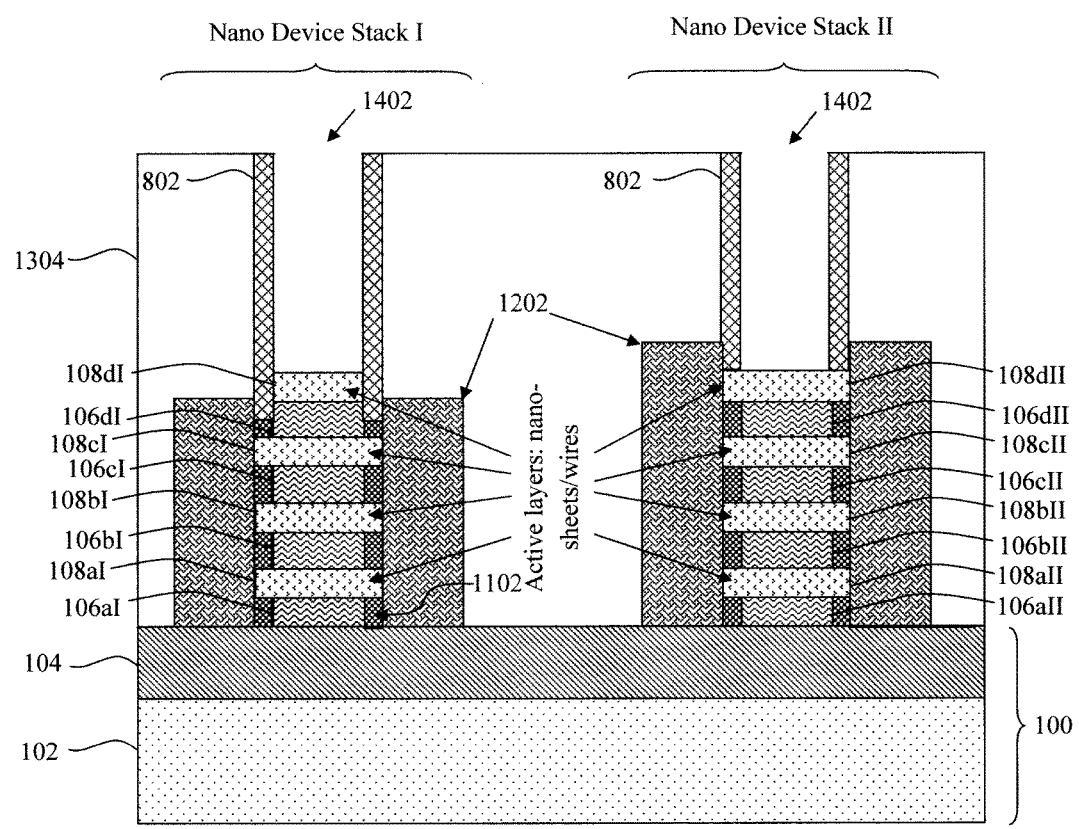
FIG. 14 is a cross-sectional diagram illustrating the dummy gates having been selectively removed from the dielectric forming trenches in the dielectric according to an embodiment of the present invention.

The dummy gates 402 are next selectively removed from the dielectric 1304. See FIG. 14. As provided above, the dummy gates 402 may be formed from poly-Si. In that case, a poly-Si selective RIE can be used in this step. As shown in FIG. 14, removal of the dummy gates 402 forms trenches 1402 in the dielectric 1304. The trenches 1402 are lined with the spacers 802.

Figure 15:
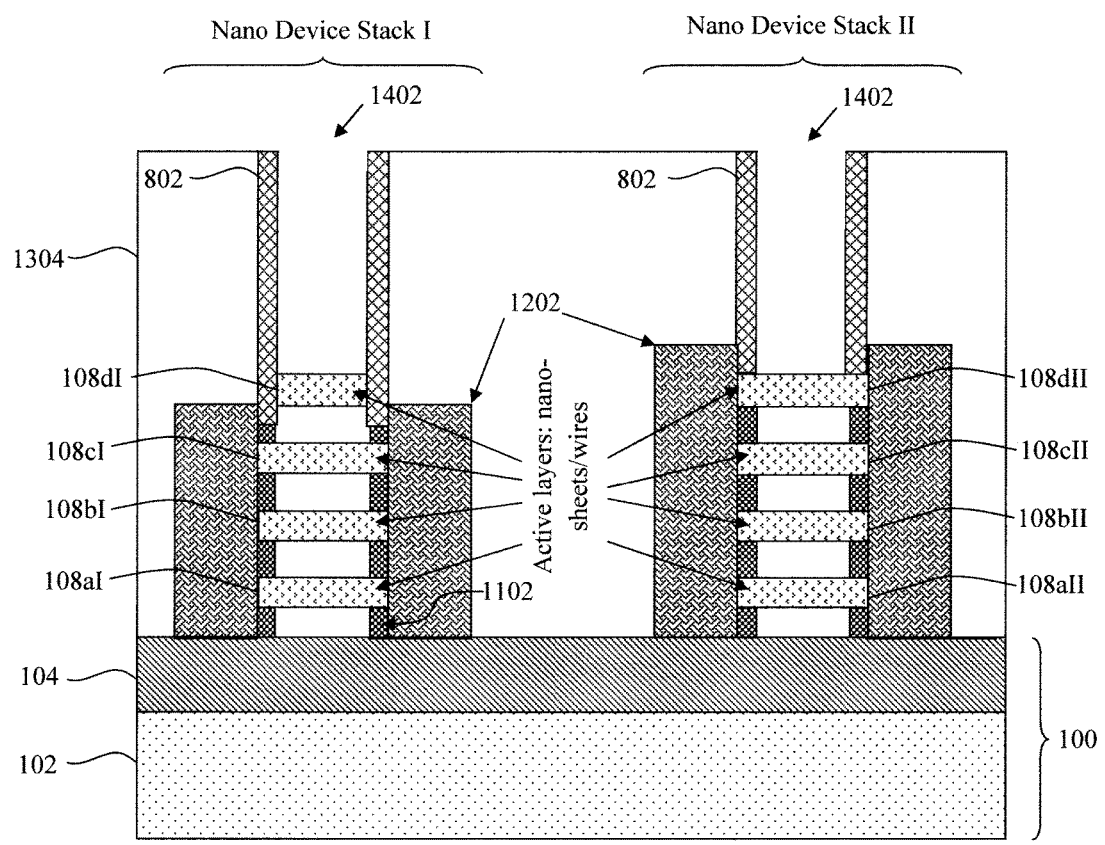
FIG. 15 is a cross-sectional diagram illustrating the sacrificial layers having been selectively removed from the nano device stacks according to an embodiment of the present invention.

Removal of the dummy gates exposes the nano device stack and, as shown in FIG. 15, enables the sacrificial layers to be selectively removed from the nano device stacks. The ends of the active layers (e.g., nano-sheets/wires—see above) are supported by the source and drain regions 1202.

As provided above, by removing the sacrificial layers from the nano device stacks, the active layers are fully suspended which permits the replacement gate to be formed fully surrounding at least a portion of each of the active layers. This configuration is also referred to herein as a gate-all-around or GAA configuration.

The sacrificial layers may be removed selective to the active layers using an isotropic etching process. As provided above, by way of example only, a HF acid etch is selective for Si, while a HCL etch is selective for SiGe. Thus, the particular etch chemistry can be selected based on the composition of the sacrificial layers.

Replacement gates 1602 are then formed in the trenches 1402. See FIG. 16. In the example shown, the replacement gates 1602 fully surround a portion of each of the active layers in a GAA configuration. According to an exemplary embodiment, the replacement gates 1602 are metal gates. Prior to depositing the metal gate, a gate dielectric (not shown) is typically deposited (e.g., conformally) on the active layers (e.g., nano-sheets/wires—see above) within the trenches 1402, such that the gate dielectric separates the active layers from the replacement gate. Suitable gate dielectrics for a replacement metal gate process include, but are not limited to, hafnium oxide ($HfO_2$) or lanthanum oxide ($La_2O_3$). By way of example only, one possible configuration of the replacement gate includes a workfunction setting metal layer on the gate dielectric, and a filler gate metal layer on the workfunction setting metal layer. Suitable n-type workfunction setting metals include, but are not limited to, titanium nitride (TiN) and tantalum nitride (TaN). Suitable p-type workfunction setting metals include, but are not limited to, tungsten (W). Suitable filler gate metals include, but are not limited to, aluminum (Al). The portions of the active layers surrounded by the replacement gate serve as a channel region of the respective devices.

Figure 16:
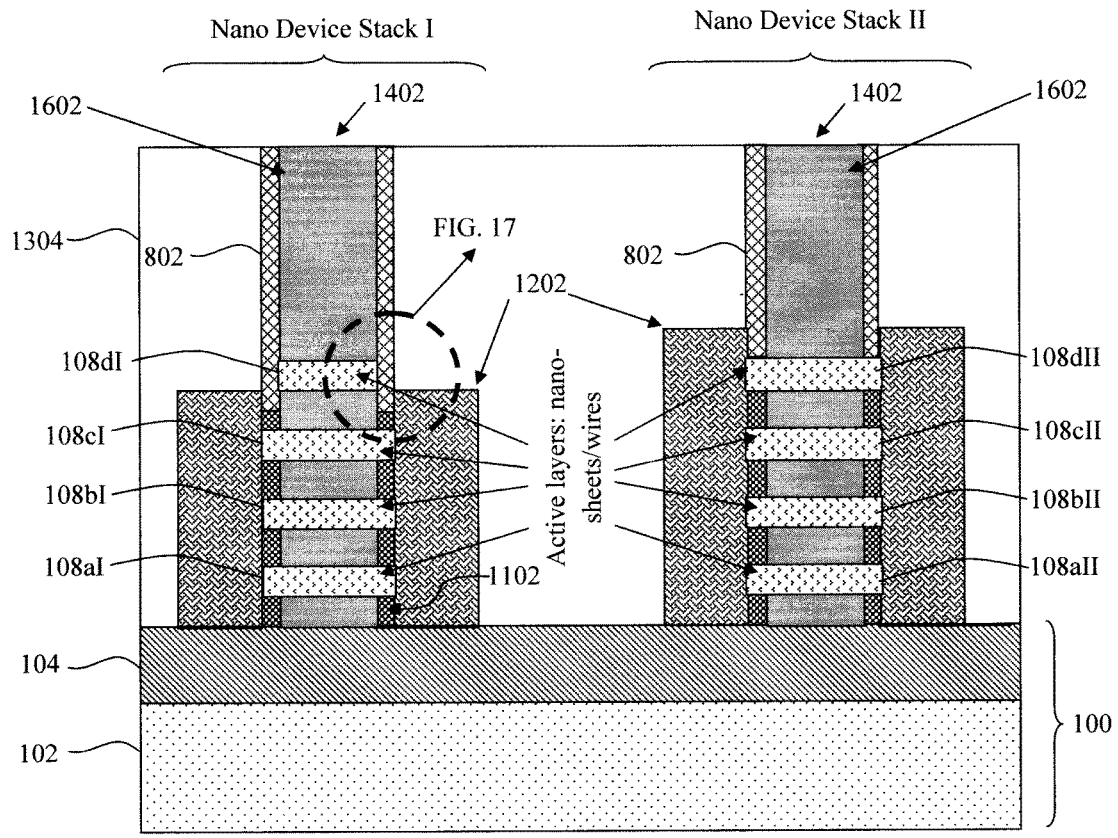
FIG. 16 is a cross-sectional diagram illustrating replacement gates having been formed in the trenches according to an embodiment of the present invention.

As shown in FIG. 16, while the topmost nano-sheet/wire (formed in this example from active layer 108dI) in the Nano Device Stack I is surrounded by a replacement gate 1602, this nano-sheet/wire has been cut (see above) so it is not connected to the source and drain regions 1202. Thus, this cut nano-sheet/wire does not carry current and therefore does not contribute to the overall effective device width. Thus, to use the non-limiting example depicted in FIG. 16, the Nano Device Stack I contains three current carrying nano-sheets/wires (channels) while the Nano Device Stack II contains four current carrying nano-sheets/wires (channels). Thus, in this example, the Nano Device Stack II has a greater effective width than the Nano Device Stack I. As previously mentioned, the number of sacrificial/active layers formed in the stack can vary, as can the number of active layers cut from the top of the stack. Thus, what is shown in the figures is merely an example.

Figure 17:
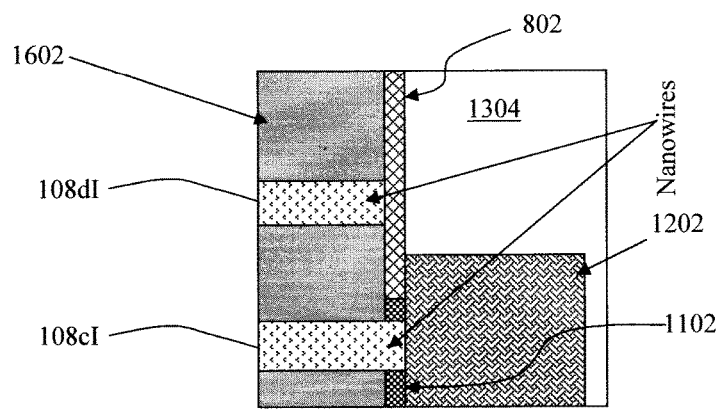
FIG. 17 is an expanded view of the nano device stack and first/second spacers according to an embodiment of the present invention.

As highlighted above, a combination of spacers separates the replacement gates from the source and drain regions, and wherein one of the sets of spacers cuts off one or more of the active layers in one or more of the nano device stacks from the source and drain regions. Namely, as shown in FIG. 17, (first) spacers 802 and (second) spacers 1102 separate the replacement gates 1602 from the source and drain regions 1202. This is a result of the present process where the active layers are cut at the top of the stack and then blocked off using the (first) spacers 802. A subsequent recess of the sacrificial layers and spacer deposition results in the formation of the (second) spacers 1102. Advantageously, this configuration enables the use of different spacer materials, if so desired, for forming the spacers 802 and 1102.

To further illustrate this unique aspect of the present devices, an enlarged view of one of the devices is provided in FIG. 17. In this example, the device has the topmost active layer cut off from the source and drain regions is depicted. However, the same basic concept applies to both devices. As shown in FIG. 15, the topmost nano-sheet/wire (formed from active layer 108dI), which has been cut, is blocked by the spacers 802 and thus not connected to the source and drain regions 1202. By contrast, the next nano-sheet/wire down in the nano device stack (in this example, the nano-sheet/wire formed from active layer 108cI) was not cut off from the source and drain regions 1202. In the example shown, a first set of spacers 802 is present in the region of the cut nano-sheet/wire, whereas a second set of spacers 1102 is present further below in the stack.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a semiconductor device, comprising the steps of:
    forming an alternating series of sacrificial and active layers on a wafer;
    patterning the alternating series of sacrificial and active layers into at least one nano device stack;
    forming a dummy gate on the at least one nano device stack;
    patterning at least one upper active layer in the at least one nano device stack to remove all but a portion of the at least one upper active layer beneath the dummy gate;
    forming spacers on opposite sides of the dummy gate covering the at least one upper active layer that has been patterned;
    forming source and drain regions on opposite sides of the at least one nano device stack, wherein the at least one upper active layer is separated from the source and drain regions by the spacers whereby the spacers electrically insulate the at least one upper active layer from the source and drain regions; and
    replacing the dummy gate with a replacement gate.

2. The method of claim 1, wherein the active layers comprise a first material and the sacrificial layers comprise a second material, and wherein the first material is etchable selective to the second material.

3. The method of claim 2, wherein the first material and the second material are each selected from the group consisting of: silicon, silicon germanium, III-V materials, and II-VI materials.

4. The method of claim 1, further comprising the step of:
    patterning each of the sacrificial and active layers in the at least one nano device stack beneath the at least one upper active layer to remove all but a portion of each of the sacrificial and active layers in the at least one nano device stack beneath the at least one upper active layer covered by the dummy gate and the spacers.

5. The method of claim 1, wherein the spacers comprise a first set of spacers, the method further comprising the steps of:
    recessing the sacrificial layers in the at least one nano device stack prior to forming the source and drain regions; and
    forming a second set of spacers in gaps left by recessing the sacrificial layers, wherein the replacement gate is separated from the source and drain regions by both the first set of spacers and the second set of spacers.

6. The method of claim 5, wherein the first set of spacers comprises a different material from the second set of spacers.

7. The method of claim 1, further comprising the step of:
removing the sacrificial layers selective to the active layers from the at least one nano device stack such that the replacement gate surrounds at least a portion of each of the active layers in a gate-all-around configuration.

8. A method of forming a semiconductor device, comprising the steps of:
forming an alternating series of sacrificial and active layers on a wafer;
patterning the sacrificial and active layers into multiple nano device stacks;
forming dummy gates on each of the nano device stacks;
forming a mask that selectively covers at least a second one of the nano device stacks, leaving at least one first nano device stack uncovered;
patterning at least one upper active layer in the at least one first nano device stack to remove all but a portion of the at least one upper active layer beneath the dummy gates on the at least one first device stack;
removing the mask after the at least one upper active layer has been patterned;
forming spacers on opposite sides of the dummy gates, wherein the spacers cover the at least one upper active layer that has been patterned in the at least one first nano device stack;
forming source and drain regions on opposite sides of the nano device stacks, wherein the at least one upper active layer is separated from the source and drain regions by the spacers in the at least one first nano device stack whereby the spacers electrically insulate the at least one upper active layer from the source and drain regions in the at least one first nano device stack; and
replacing the dummy gates with replacement gates.

9. The method of claim 8, wherein the active layers comprise a first material and the sacrificial layers comprise a second material, and wherein the first material is etchable selective to the second material.

10. The method of claim 9, wherein the first material and the second material are each selected from the group consisting of: silicon, silicon germanium, III-V materials, and II-VI materials.

11. The method of claim 8, further comprising the step of:
patterning each of the sacrificial and active layers beneath the at least one upper active layer in the at least one first nano device stack to remove all but a portion of each of the sacrificial and active layers in the at least one first nano device stack beneath the at least one upper active layer covered by the dummy gates and the spacers.

12. The method of claim 8, wherein the spacers comprise a first set of spacers, the method further comprising the steps of:
recessing the sacrificial layers in the nano device stacks prior to forming the source and drain regions; and
forming a second set of spacers in gaps left by recessing the sacrificial layers,
wherein the replacement gates are separated from the source and drain regions by both the first set of spacers and the second set of spacers.

13. The method of claim 12, wherein the first set of spacers comprises a different material from the second set of spacers.

14. The method of claim 8, further comprising the step of:
removing the sacrificial layers selective to the active layers from the nano device stacks such that the replacement gates surround at least a portion of each of the active layers in a gate-all-around configuration.

* * * * *